(12) United States Patent
Delano et al.

(10) Patent No.: US 9,746,888 B2
(45) Date of Patent: Aug. 29, 2017

(54) UNIFORM FLOW HEAT SINK

(71) Applicant: Microsoft Technology Licensing, LLC, Redmond, WA (US)

(72) Inventors: Andrew Douglas Delano, Woodinville, WA (US); Jeffrey Taylor Stellman, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/484,596

(22) Filed: Sep. 12, 2014

(65) Prior Publication Data

US 2016/0077558 A1    Mar. 17, 2016

(51) Int. Cl.
*H05K 7/20* (2006.01)
*G06F 1/20* (2006.01)
(Continued)

(52) U.S. Cl.
CPC .............. *G06F 1/20* (2013.01); *F28F 13/06* (2013.01); *F28F 13/08* (2013.01); *G06F 1/203* (2013.01);
(Continued)

(58) Field of Classification Search
CPC ....... G06F 1/20; G06F 1/203; H05K 7/20154; F28F 13/06; F28F 13/08
(Continued)

(56) References Cited

U.S. PATENT DOCUMENTS 5,975,194 A    11/1999  Wagner
6,280,317 B1 *  8/2001  Przilas .................. H05K 7/207
                                                            361/695
(Continued)

FOREIGN PATENT DOCUMENTS

CN    1987117    6/2007
EP    2427037    8/2011
(Continued)

OTHER PUBLICATIONS

Chen, et al., "Thermal Design Optimization for Strip-Fin Heat Sinks with a Ducted Air Flow", Proceedings of the Tenth Intersociety Conference on Thermal and Thermomechanical Phenomena in Electronics Systems, May 30, 2006, pp. 297-304.
(Continued)

*Primary Examiner* — Tuan T Dinh
*Assistant Examiner* — Mukund G Patel (57) ABSTRACT

A uniform flow heat sink is described that is configured to employ variable spacing for air flow channels to account for non-uniformities in air flow due to arrangements of components within a housing of a computing device. Non-uniformities may be ascertained by analysis of an air flow profile for a computing device to detect regions of high and low flow. Air flow rates for the computing device may be balanced by configuring air flow channel spacing for the heat sink to vary around a perimeter of the heat sink and account for the ascertained non-uniformities. Air flow channel spacing may be controlled by changing the concentration, spacing, pitch, positioning and/or other characteristics of heat transfer surfaces associated with the heat sink. Generally, air flow channel spacing is increased in areas of high system impedance and decreased in areas of low system impedance to increase uniformity of flow.

20 Claims, 8 Drawing Sheets

(51) Int. Cl.
F28F 13/06 (2006.01)
F28F 13/08 (2006.01)
H01L 23/467 (2006.01)

(52) U.S. Cl.
CPC ....... H01L 23/467 (2013.01); H05K 7/20154 (2013.01); H01L 2924/0002 (2013.01)

(58) Field of Classification Search
USPC .................... 361/679.47, 694, 695, 697, 703
See application file for complete search history.

(56) References Cited

U.S. PATENT DOCUMENTS

| | | |
|---|---|---|
| 6,406,274 B1 | 6/2002 | Lin et al. |
| 6,571,862 B1 | 6/2003 | Wang et al. |
| 6,778,390 B2 * | 8/2004 | Michael ................ H01L 23/467 165/121 |
| 7,317,614 B2 | 1/2008 | Ruch et al. |
| 7,508,662 B2 | 3/2009 | Chang |
| 7,969,730 B1 | 6/2011 | Doherty et al. |
| 8,331,091 B2 * | 12/2012 | Kaslusky .............. F04D 29/582 165/121 |
| 8,432,696 B2 | 4/2013 | Ribas et al. |
| 8,477,490 B2 | 7/2013 | Rothkopf et al. |
| 8,553,415 B2 | 10/2013 | Wang et al. |
| 9,639,125 B2 | 5/2017 | Delano et al. |
| 2002/0172008 A1 | 11/2002 | Michael |
| 2003/0131970 A1 | 7/2003 | Carter et al. |
| 2003/0161102 A1 | 8/2003 | Lee et al. |
| 2007/0053168 A1 | 3/2007 | Sayir et al. |
| 2007/0086157 A1 | 4/2007 | Ruch et al. |
| 2007/0227707 A1 | 10/2007 | Machiroutu et al. |
| 2008/0011454 A1 | 1/2008 | Hwang et al. |
| 2008/0043431 A1 | 2/2008 | Marotta et al. |
| 2008/0106171 A1 | 5/2008 | Mongia |
| 2010/0123372 A1 | 5/2010 | Huang et al. |
| 2010/0220439 A1 | 9/2010 | Qin |
| 2011/0194252 A1 | 8/2011 | Wang |
| 2012/0014064 A1 | 1/2012 | Rock et al. |
| 2012/0055653 A1 | 3/2012 | Chen et al. |
| 2012/0224951 A1 | 9/2012 | Degner et al. |
| 2013/0055727 A1 | 3/2013 | Choi |
| 2013/0075065 A1 | 3/2013 | Degner et al. |
| 2013/0138262 A1 | 5/2013 | Busch et al. |
| 2013/0153199 A1 | 6/2013 | Busch et al. |
| 2013/0199759 A1 | 8/2013 | Chou |
| 2013/0250518 A1 * | 9/2013 | Chiang .............. H05K 7/20154 361/697 |
| 2014/0297231 A1 * | 10/2014 | Georgescu .......... G06F 17/5009 703/1 |
| 2015/0116928 A1 | 4/2015 | Delano et al. |

FOREIGN PATENT DOCUMENTS

| | | |
|---|---|---|
| WO | WO-0143519 | 6/2001 |
| WO | WO-2012012124 | 1/2012 |

OTHER PUBLICATIONS

Walsh, et al., "The Performance of Active Cooling in a Mobile Phone", 11th Intersociety Conference on Thermal and Thermomechanical Phenomena in Electronic Systems, May 2008, 5 pages.
"International Search Report and Written Opinion", PCT/US2014/062486, Feb. 25, 2015, 15 pages.
"Non-Final Office Action", U.S. Appl. No. 14/068,715, Aug. 4, 2015, 14 pages.
"Final Office Action", U.S. Appl. No. 14/068,715, Feb. 26, 2016, 18 pages.
"International Preliminary Report on Patentability", Application No. PCT/US2014/062486, Feb. 1, 2016, 7 pages.
"International Search Report and Written Opinion", Application No. PCT/US2015/049054, Nov. 27, 2015, 15 pages.
"Second Written Opinion", Application No. PCT/US2014/062486, Sep. 28, 2015, 9 pages.
"Non-Final Office Action", U.S. Appl. No. 14/068,715, Jun. 3, 2016, 19 pages.
"International Preliminary Report on Patentability", Application No. PCT/US2015/049054, Sep. 27, 2016, 10 pages.
"Notice of Allowance", U.S. Appl. No. 14/068,715, Dec. 19, 2016, 9 pages.

* cited by examiner

UNIFORM FLOW HEAT SINK

SUMMARY

A uniform flow heat sink for a ventilation system of a computing device is described herein. In one or more implementation, the heat sink is configured to employ variable spacing for air flow channels to account for non-uniformities in air flow created by arrangements of components within a housing of the computing device. The non-uniformities may be ascertained by analysis of an air flow profile for the computing device. Air flow rates for the computing device may be balanced by configuring air flow channel spacing for a heat sink of the ventilation system to vary around a perimeter of the heat sink to account for the non-uniformities in air flow that are ascertained. Air flow channel spacing may be controlled by changing the concentration, spacing, pitch, positioning and/or other characteristics of heat transfer surfaces associated with the heat sink. Generally, air flow channel spacing is increased in areas of high system impedance and decreased in areas of low system impedance to achieve increased uniformity of flow.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Computing devices may include various electronic components that produce heat during operation (e.g., heat generating devices), such as central processing units, graphical processing units, and so forth. Since such devices can be damaged by overheating, the computing device may include a ventilation system. In one arrangement, a blower (e.g., fan) may employed to provide air flow to cool a heat sink or other thermal transfer device situated near the outlet of blower. The heat sink may be configured to include a plurality of heat transfer surfaces (such as fins and/or channels) that draw heat from the heat generating devices and are cooled via the blower. Thus, heat may be communicated from the heat generating devices to the heat transfer surfaces by conduction and/or phase change convection (e.g., a heat pipe), and air blowing from the outlet of the blower. Traditionally, though, heat transfer surfaces are uniformly arranged such as being distributed and/or spaced evenly at the blower's exhaust. Since air flow characteristics external to the blower and heat sink of a computing device may vary in different regions, uniform arrangement of heat transfer surfaces may provide non-uniform flow and inefficient cooling. Additionally, noise associated with the blower may be attributed at least in part to sound pressure produced by having uniformly arranged heat transfer surfaces.

A uniform flow heat sink for a ventilation system of a computing device is described herein. In one or more implementation, the heat sink is configured to employ variable spacing for air flow channels to account for non-uniformities in air flow created by arrangements of components within a housing of the computing device. The non-uniformities may be ascertained by analysis of an air flow profile for the computing device. Air flow rates for the computing device may be balanced by configuring air flow channel spacing for a heat sink of the ventilation system to vary around a perimeter of the heat sink to account for the non-uniformities in air flow that are ascertained. Air flow channel spacing may be controlled by changing the concentration, spacing, pitch, positioning and/or other characteristics of heat transfer surfaces associated with the heat sink. Generally, air flow channel spacing is increased in areas of high system impedance and decreased in areas of low system impedance to increase uniformity of flow. Balancing the air flow in the manner described herein optimally distributes and makes use of heat transfer surfaces which may increase the effectiveness of the heat sink. Additionally, varying the air flow channel spacing may result in a reduction of noise generated by the ventilation system (e.g., a fan or blower) relative to using uniform spacing.

In the following discussion, an example environment is first described that may employ the heat transfer techniques described herein. Example details and procedures are then described which may be performed in the example environment as well as other environments. Consequently, the details and procedures are not limited to the example environment and the example environment is not limited to implementation of the example details and procedures.

Example Operating Environment

Figure 1:
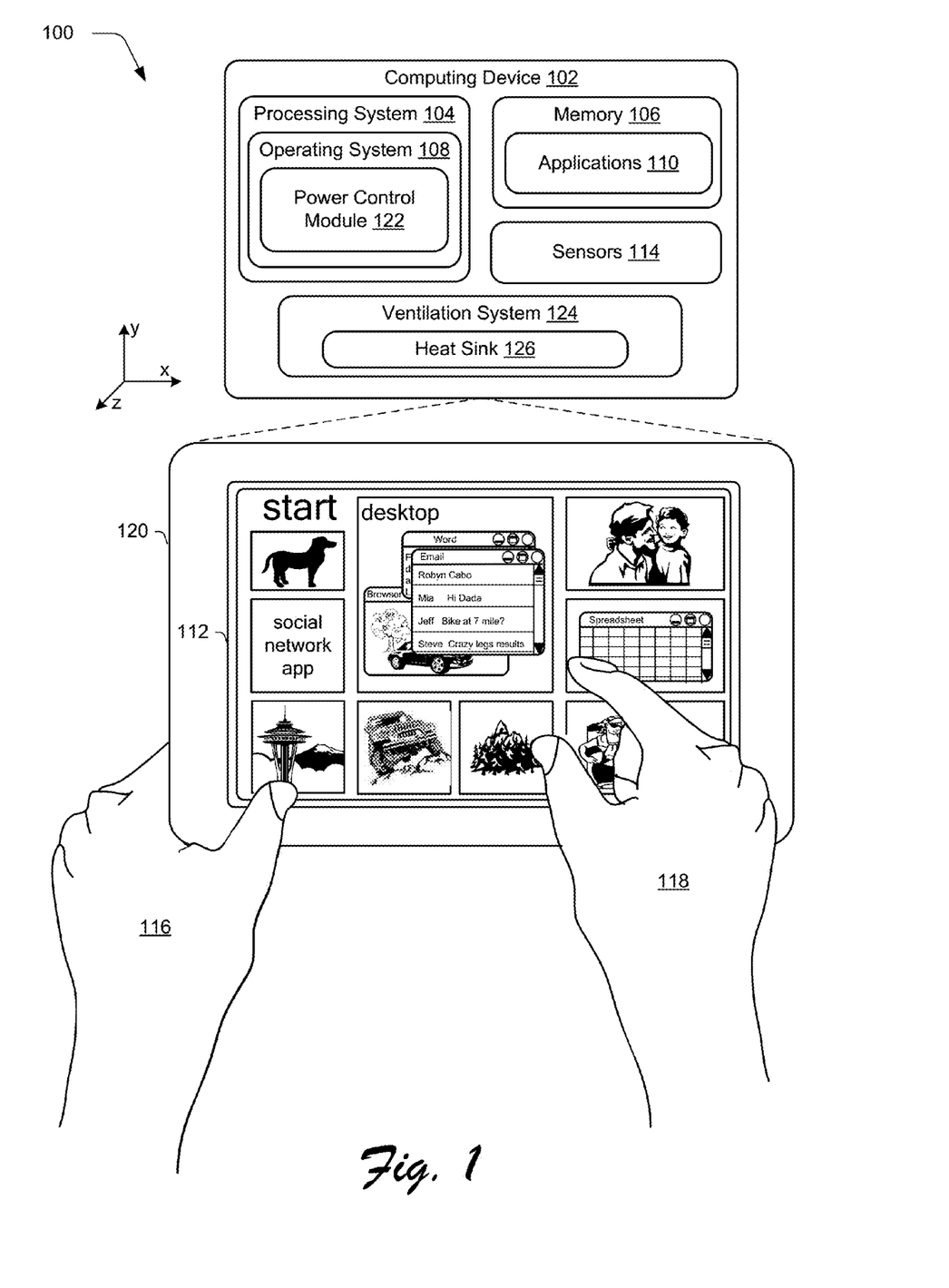
FIG. 1 is an illustration of an operating environment that is operable to employ a heat sink in accordance with one or more implementations.

FIG. 1 is an illustration of an environment 100 in an example implementation that is operable to employ techniques described herein. The illustrated environment 100 includes a computing device 102 having a processing system 104 and a computer-readable storage medium that is illustrated as a memory 106 although other configurations are also contemplated as further described below.

The computing device 102 may be configured in a variety of ways. For example, a computing device may be configured as a computer that is capable of communicating over a network, such as a desktop computer, a mobile station, an entertainment appliance, a set-top box communicatively coupled to a display device, a wireless phone, a game console, and so forth. Thus, the computing device 102 may range from full resource devices with substantial memory and processor resources (e.g., personal computers, game consoles) to a low-resource device with limited memory and/or processing resources (e.g., traditional set-top boxes, hand-held game consoles). Additionally, although a single computing device 102 is shown, the computing device 102 may be representative of a plurality of different devices, such as multiple servers utilized by a business to perform operations such as by a web service, a remote control and set-top box combination, an image capture device and a game console configured to capture gestures, and so on. Further discussion of different configurations that may be assumed by the computing device may be found in relation to FIG. 10.

The computing device 102 is further illustrated as including an operating system 108. The operating system 108 is configured to abstract underlying functionality of the computing device 102 to applications 110 that are executable on the computing device 102. For example, the operating system 108 may abstract the processing system 104, memory 106, network, and/or display device 112 functionality of the computing device 102 such that the applications 110 may be written without knowing "how" this underlying functionality is implemented. The application 110, for instance, may provide data to the operating system 108 to be rendered and displayed by the display device 112 without understanding how this rendering will be performed. The operating system 108 may also represent a variety of other functionality, such as to manage a file system and user interface that is navigable by a user of the computing device 102.

The computing device 102 may support a variety of different interactions. For example, the computing device 102 may include one or more hardware devices that a user may manipulate to interact with the device, such as a keyboard, cursor control device (e.g., a mouse, track pad, or touch device), and so on. The computing device 102 may also support gestures, which may be detected in a variety of ways. The computing device 102, for instance, may support touch gestures that are detected using touch functionality of the computing device 102. The sensors 114, for instance, may be configured to provide touchscreen functionality in conjunction with the display device 112, alone as part of a track pad, and so on. An example of this is illustrated in FIG. 1 in which first and second hands 116, 118 of a user are illustrated. The first hand 116 of the user is shown as holding a housing 120 of the computing device 102. The second hand 118 of the user is illustrated as providing one or more inputs that are detected using touchscreen functionality of the display device 112 to perform an operation, such as to make a swipe gesture to pan through representations of applications in the start menu of the operating system 108 as illustrated.

Thus, recognition of the inputs may be leveraged to interact with a user interface output by the computing device 102, such as to interact with a game, an application, browse the internet, change one or more settings of the computing device 102, and so forth. The sensors 114 may also be configured to support a natural user interface (NUI) that may recognize interactions that may not involve touch. For example, the sensors 114 may be configured to detect inputs without having a user touch a particular device, such as to recognize audio inputs through use of a microphone. For instance, the sensors 114 may include a microphone to support voice recognition to recognize particular utterances (e.g., a spoken command) as well as to recognize a particular user that provided the utterances.

In another example, the sensors 114 may be configured to detect movement of the computing device 102 in one or more dimensions, such as the x, y, and z dimensions as illustrated, through use of accelerometers, gyroscopes, inertial measurement units (IMUs), magnetometers, and so on. This movement may be recognized in whole in part as part of a definition of a gesture. For example, movement of the computing device 102 in the z axis may be used to zoom in a user interface displayed on the display device 112, rotation through the x axis may be used to steer a car in a video game, and so on. Thus, in this example the computing device 102 may be moved through a variety of different orientations to support interaction with the device.

In a further example, the sensors 114 that may be configured to recognize gestures, presented objects, images, and so on through implementations as one or more cameras. The cameras, for instance, may be configured to include multiple lenses so that different perspectives may be captured and thus determine depth. The different perspectives, for instance, may be used to determine a relative distance from the sensors 114 and thus a change in the relative distance. The different perspectives may be leveraged by the computing device 102 as depth perception. The images may also be leveraged by the computing device 102 to support a variety of other functionality, such as techniques to identify particular users (e.g., through facial recognition), objects, and so on. It should also be noted that the sensors 114 may also support detection of movement as described above in one or more of the x, y, or z axes through implementation as a camera.

The computing device 102 is further illustrated as including a power control module 122. The power control module 122 is representative of functionality to cause a device to enter different power consumption states. The processing system 104, for instance, may be configured to support a low power state in which processing resources are lessened and power consumption of the processing system 104 is also lessened. Thus, the processing system 104 may be configured to conserve resources (e.g., from a battery) while in this low power state.

During operation, the processing system 104 and other components may act as heat-generating devices that may produce heat levels in excess of "safe" limits if left unmitigated. As such thermal limits are approached, the computing device may have to be shutdown and/or operation of the processing system 104 may be throttled, which adversely affects performance. Accordingly, computing devices may include some type of thermal management system to manage heat-generating device.

In accordance with principles discussed in this document, the computing device 102 includes a ventilation system 124 used for thermal management that may include a heat sink 126 designed to facilitate uniform flow. As discussed in the details section that follows, the ventilation system 124 and heat sink 126 may be configured to account for non-uniformities is air flow caused by arrangements of components within a housing of the computing device (e.g., system air flow impedance). In order to do so, air flow channel spacing for the heat sink may be varied to account for the non-uniformities and balance the flow. Generally speaking, air flow channel spacing may be increased in areas identified as having high system impedance and decreased in areas identified as having low system impedance. Balancing the air flow in the manner described herein optimally distributes and makes use of heat transfer surfaces which may increase the effectiveness of the heat sink. Additionally, varying the air flow channel spacing may result in a reduction of noise generated by the ventilation system 124 (e.g., a fan or blower) relative to using uniform spacing.

Having considered the foregoing example operating environment, consider now a discussion of example details and procedures for a uniform flow heat sink in accordance with one or more implementations.

Uniform Flow Heat Sink Implementation Details

The section describes details and examples regarding a uniform flow heat sink in accordance with one or more implementations. In general, functionality, features, and concepts described in relation to the examples above and below may be interchanged among one another and are not limited to implementation in the context of a particular figure or procedure. Moreover, blocks associated with different representative components and procedures and corresponding figures herein may be applied together and/or combined in different ways. Thus, individual functionality, features, and concepts described in relation to different example environments, devices, components, and procedures herein may be used in any suitable combinations and are not limited to the particular combinations represented by the enumerated examples in this description.

Figure 2:
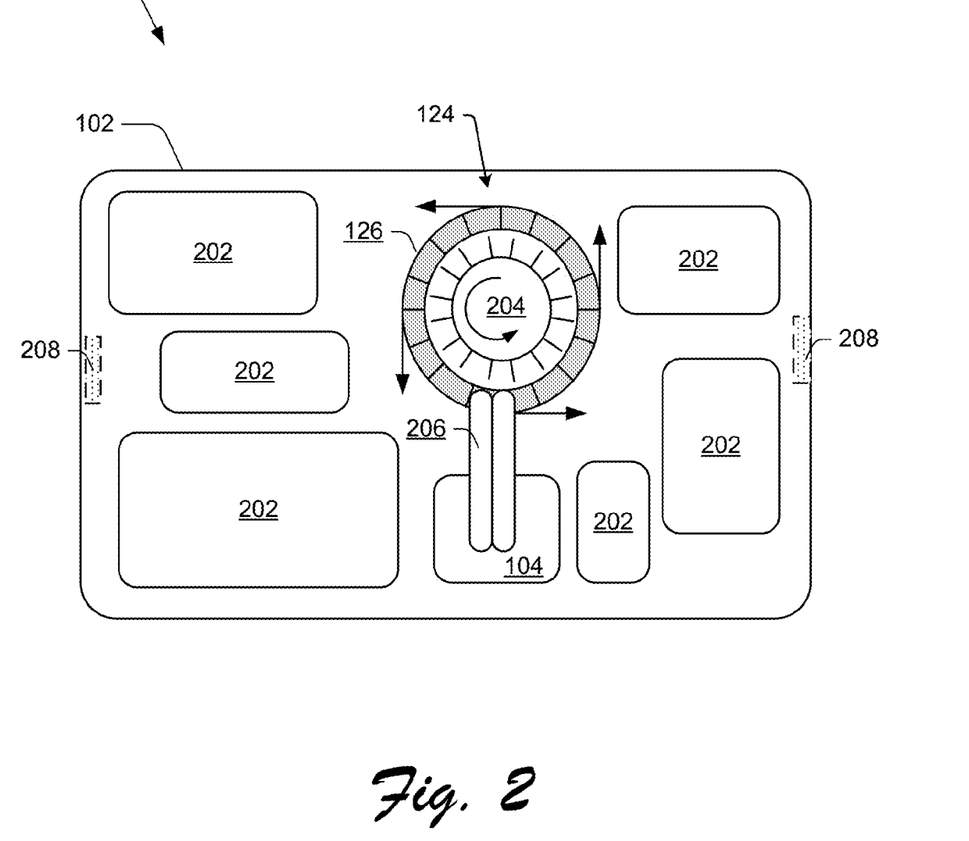
FIG. 2 depicts an example of a ventilation system of FIG. 1 that includes a heat sink in accordance with one or more implementations.

FIG. 2 depicts generally at 200 an example representation of a ventilation system 124 of FIG. 1 that employs a heat sink 126 in accordance with one or more implementations. In the example of FIG. 2, the ventilation system 124 is illustrated as being arranged within a housing of a computing device 102. The computing device 102 may include a plurality of heat-generating devices 202 that are depicted as being arranged throughout the housing in an arrangement. The heat-generating devices 202 may include a processing system 104 as described in relation to FIG. 1, as well as other components of the computing device such as a power supply unit, a battery, a microprocessor, and a graphics processor, to name a few examples. FIG. 2 additionally represents flow through the ventilation system 124 for cooling of components of a corresponding computing device using arrows to show the general flow paths from the ventilation system to heat-generating devices 202. Although aspects are described herein in relation to air cooling, comparable techniques may be used in connection with other types of fluid cooling systems that employ different types of gases and even liquids.

The ventilation system 124 as represented in FIG. 2 includes the heat sink 126, a blower 204, and one or more heat-expelling devices 206 used to convey heat away from heat generating devices 202 to the heat sink 126 for cooling via the blower 204. In accordance with techniques described in this document, the heat sink 126 may be arranged in conjunction with the blower 204 to create variable air flow channel spacing that accounts for non-uniform flow characteristics associated with the particular arrangement of components employed for the computing device. Examples and details regarding suitable arrangements of a heat sink 126 with a blower 204 to increase uniformity of air flow can be found in relation to FIGS. 3 to 6 below.

The blower 204 is provided that is designed to pull air from an exterior of the housing through an intake into an interior of the housing. The blower 204 is representative of functionality to move and disperse cooling fluid for the system, which in this case is air. The blower 204 may be configured in various ways, such as being an axial fan or a centrifugal blower for moving air. Pumps, impellers, and other types of fluid movers may also be employed in alternative designs and/or in conjunction with other types of cooling fluids. The blower 204 is designed to disperse air throughout the interior of the housing via one or more flow conduits to various heat-generating devices 202. Various types of flow conduits are contemplated such as channels that are formed in the housing, piping systems, tubes, manifolds, baffles, and so forth. Cooling air that is drawn into the device by the blower 204 and delivered to the heat-generating devices 202 operates to cool the device by thermal conductivity, which heats up the air. The heated air flows from the heat-generating devices 202 to exhaust vents 208 where the heated air is expelled from the system.

Heat-expelling devices 206 may be configured to transfer heat away from the heat-generating device 202 through use of thermal conductivity, phase transition, cooling fins, evaporation, heat sinks, and other techniques to convey heat away from the device. Heat-expelling devices 206 may be used to draw heat away from various device to the heat sink 126 for cooling. For example, the heat-expelling device 206 may be in the form of one or more heat pipes (as illustrated in FIG. 2) that are configured as enclosed tubes of thermally conductive material, e.g., a metal such as copper, and thus may conduct heat away from the heat-generating device 202 using thermal conductivity. Heat may be drawn out to vents of the device or other exhaust mechanisms. In addition or alternatively to using heat pipes, other types of techniques and components may be employed to draw heat away from the heat-generating device such as phase transition devices, vapor chambers, cooling fins, a heat sink, and so forth. Generally, any highly conductive device and/or materials may be used as a heat transfer mechanism.

Figure 3:
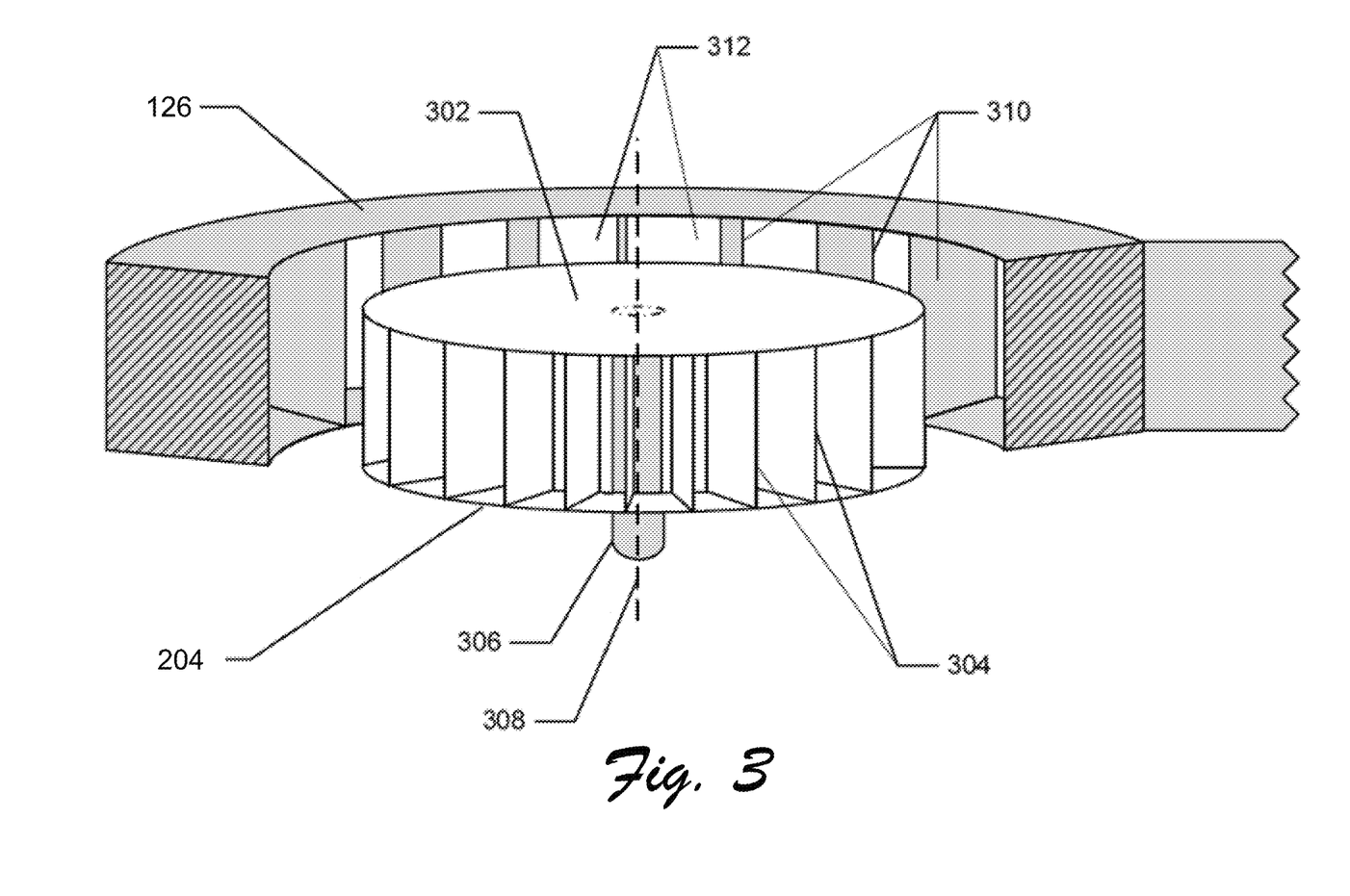
FIG. 3 depicts an example of blower arranged in combination with a heat sink in accordance with one or more implementations.

FIG. 3 is a perspective view of a blower 204 arranged in combination with a heat sink 126. In this example, the blower 204 is configured as a centrifugal fan unit, although other configurations are also contemplated. The blower 204 is depicted as including a hub 302, a plurality of blades 304, and a motor 306. The hub 302 may be a rotatable hub, and the motor 306 may be configured to rotate the hub 302 about an axis 308, illustrated as dashed line in FIG. 3. The motor 306 may be a direct current or alternating current electric motor. Alternatively, a non-electric motors may be employed. Although depicted in FIG. 3 as being located inside the hub 302, the motor 306 may be located external to the hub 302 in which case cables or belts may be employed to couple the motor 306 to the hub 302 and rotate the hub 302. The plurality of blades 304 may be formed as part of the hub 302 during manufacturing, or may be separately manufactured components. The plurality of blades 304 are illustrated in FIG. 3 as having an orientation such that they are perpendicular to the axis of rotation, however, the blades 304 may be oriented in some other fashion.

Air flow from the blower 204 proceeds outwards in trajectories that are tangential to the axis 308. The air flow proceeds towards the heat sink 126 which includes a plurality of heat transfer surfaces 310. The heat transfer surfaces 310 are illustrated in FIG. 3 as thin fin structures. In addition or alternatively, other, more, and/or fewer, heat transfer surfaces may be used, such as fins with various features to increase heat transfer surface area, fins-on-fins, dimples, bumps, ridges, irregular-shaped fins, groves, and so forth. Arrangement of the heat sink 126 and heat transfer surfaces 310 with the blower 204 forms air flow channels 312 through which cooling of the heat sink 126 as well as heat generating devices 202 may occur.

Characteristics of the heat transfer surfaces 310 may be selected and varied to control spacing of the air flow channels around the perimeter of the blower 204. For example, characteristics of the heat transfer surfaces 310 including but not limited to concentration of surfaces, pitch angle, size, shape, alignment, spacing, and positioning may be varied radially around the heat sink. Various combinations of heat transfer surfaces 310 may also be used, such that different individual surfaces or regions of the heat sink 126 may be arranged to have different pitch angles, sizes, shapes, spacing, and other variable characteristics. By using a non-uniform arrangement of heat transfer surfaces 310, flow characteristics through the heat sink 126 may be adjusted to balance the air flow with respect to an observed, baseline flow profile that indicates non-uniformities in flow and impedance. In other words, the non-uniform arrangement of heat transfer surfaces 310 may be employed to compensate for differences in flow/impedance associated with different components and regions of the computing device and thereby achieve increased uniformity of flow.

Blower designs other than the one illustrated in FIG. 3 may be utilized. For example, the plurality of blades 304 may be tilted forward with respect to the direction of rotation (such that outside edges of the blades (those further from the center of the hub 302) proceed ahead of the inside edges of the blades) or tilted backwards with respect to the direction of rotation (such that the inside edges of the blades proceed ahead of the outside edges of the blades). The blades may also be angled with respect to the heat transfer surfaces 310, such that top edges of the blades 304 proceed ahead of bottom edges of the blades 304, or vice versa. The blades may be curved (either forward or backward, or from top to bottom), and so forth. Various combinations of blades may also be used, such that some angled, some tilted, and some curved or irregular-shaped blades may be used on the same fan. The hub 302 may only partially enclose the plurality of blades 304, or may not enclose the plurality of blades 304 at all.

In accordance with the forgoing examples and principles, a ventilation system 124 for a computing device 124 may include a heat sink 126 that uses variable arrangements of heat transfer surfaces 310. The particular arrangement of heat transfer surfaces 310 may be dependent upon flow characteristics of the computing device. A flow profile indicative of the flow characteristics for a computing device having an arrangement of a plurality of components may be obtained based on computer-aided flow modeling or experimentally. The flow profile is configured to indicate non-uniformities in flow for individual components and/or regions of the computing device. The flow profile may provide data that may be used to identify and distinguish between regions of low impedance/high flow and regions of high impedance/low flow. The flow characteristics for a particular system are functions of various factors including but not limited to the layout of components, types of components, materials used for the components and the device, size/thickness of the housing, blower type/size, ventilation system attributes, and so forth. These and other factors may be considered to generate a flow profile that represents the particular system.

Figure 4:
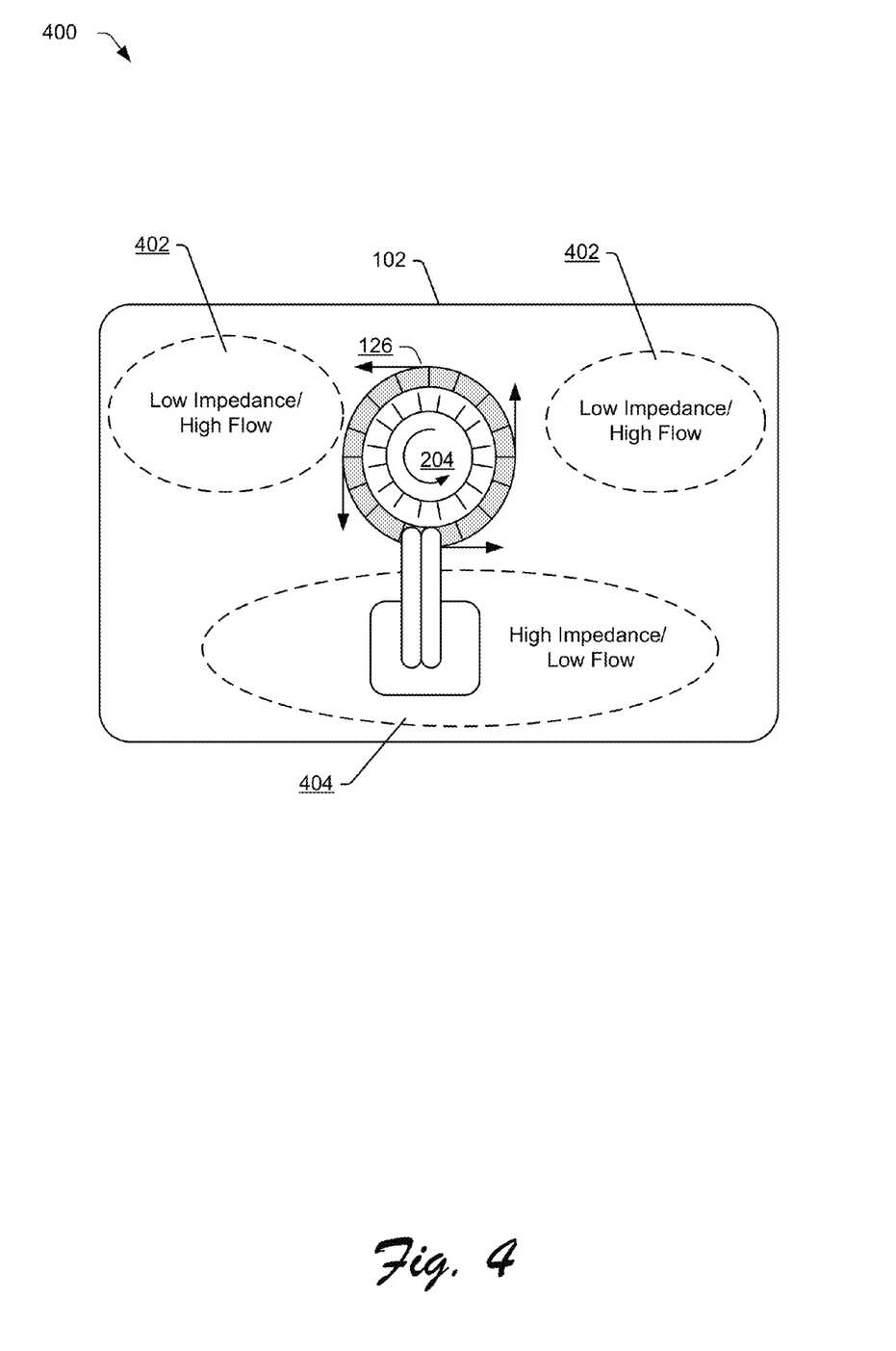
FIG. 4 is a diagram depicting an example representation of non-uniform flow characteristics that may be associated with an example computing device.

By way of example, FIG. 4 depicts generally at 400 an example representation of non-uniform flow characteristics that may be associated with an example computing device. In the depicted example, different portions of a computing device 102 are shown as being associated with different impedance and flow levels. For example, regions 402 are associated with low impedance/high flow and a region 404 is associated with high impedance/low flow. A flow profile for the computing device 102 may reflect these regions having different flow characteristics. For simplicity, high and low levels for impedance and flow are represented. However, a variety of different level categories may be defined within a range of flows and/or the flow profile may reflect actual values measured/computed for individual regions rather than using level categories. As noted previously, characteristics of the ventilation system 124 and in particular the heat sink 126 may be designed and/or modified to compensate for non-uniform flow characteristics, such as those represented in FIG. 4.

Figure 5:
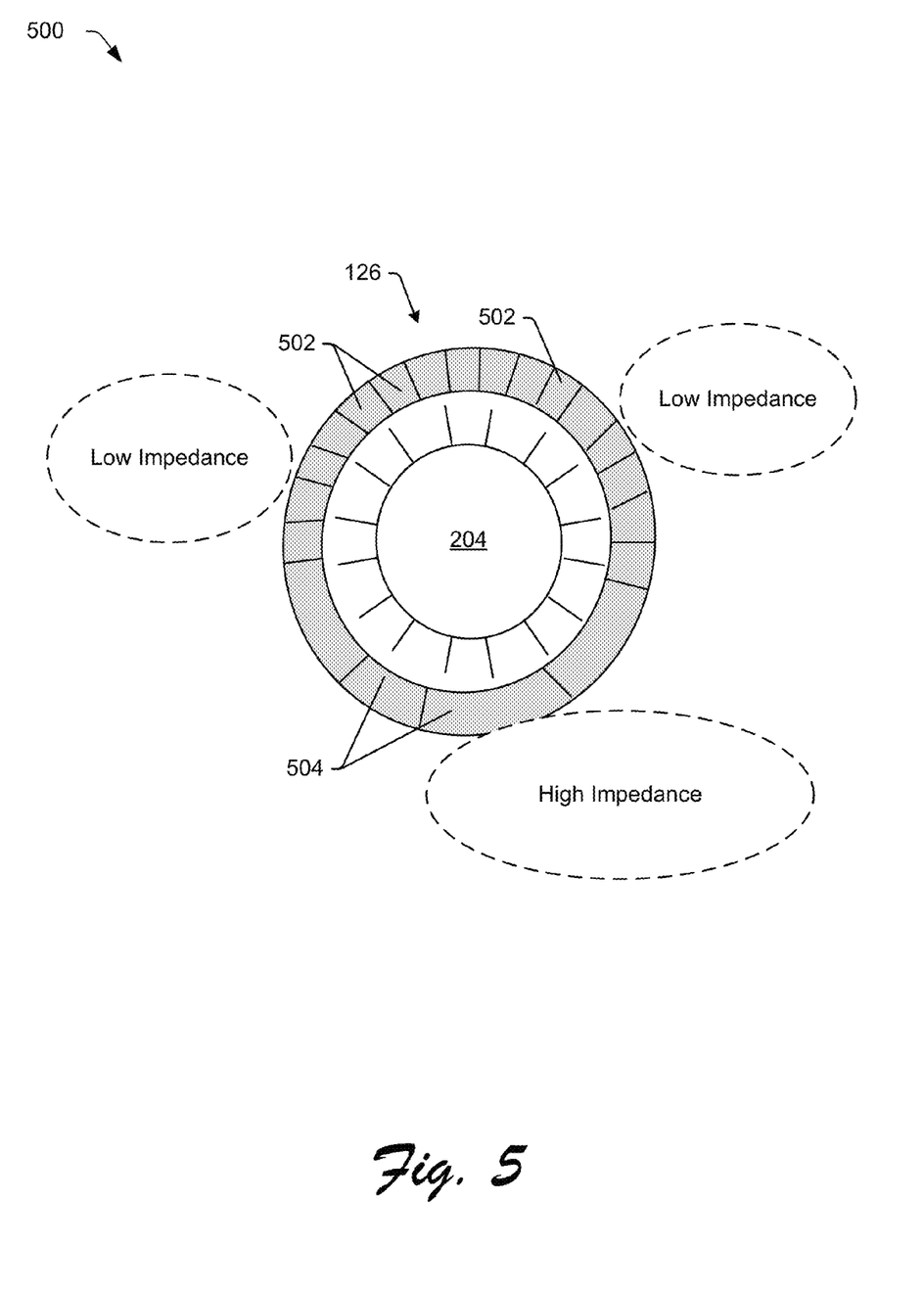
FIG. 5 is a diagram depicting an example of varying characteristics of heat transfer surfaces of a heat sink to compensate for non-uniform flow characteristics.

An example of varying characteristics of heat transfer surfaces 310 of a heat sink 126 to compensate for non-uniform flow characteristics is represented in FIG. 5, generally at 500. In the depicted example, an example heat sink 126 is illustrated that is configured to account for the non-uniform flow characteristics represented in the example of FIG. 4. In particular, the heat sink 126 is depicted as having heat transfer surfaces 310 that vary around the perimeter of the blower to create air flow channels that compensate for differences in baseline flow and impedance for the system. For example, various characteristics of heat transfer surfaces 310 may be adjusted to create narrow channels 502 in areas of low impedance, which may restrict flow in these areas. Likewise, heat transfer surfaces 310 may be adjusted to create wide channels 502 in areas of high impedance, which may facilitate greater flow in these areas. The narrow channels 502 operate to increase flow impedance relative the wide channels 502 which may decrease flow impedance. Thus, by selectively varying the characteristics of heat transfer surfaces 310, non-uniformities in flow may be balanced.

As mentioned, characteristics of heat transfer surfaces 310 of a heat sink may be varied in various ways to increase uniformity of flow for a ventilation system. In one approach, pitch angles of heat transfer surfaces 310 configured as fins may be varied radially around the heat sink. The pitch angle for at least some fins may be increased in areas of low impedance/high flow to reduce the flow and decreased in areas of high impedance/low flow to increase the flow, thereby balancing the flow. In addition or alternatively, the concentration or density of fins or other heat transfer surfaces 310 may be varied. Generally, higher concentration of surfaces will create additional impedance and lower flow relative to lower concentration. Spacing is another example characteristics of heat transfer surfaces 310 that may be varied to produce corresponding air flow channels that compensate for flow characteristics. Other characteristics of heat transfer surfaces 310 that may be varied in accordance with the described techniques include but are not limited to size, shape, alignment, and positioning. One or more of the example characteristics may be employed individually as well as in combinations with one another to create various non-uniform arrangements of heat transfer surfaces 310 for a heat sink 126.

Figure 6:
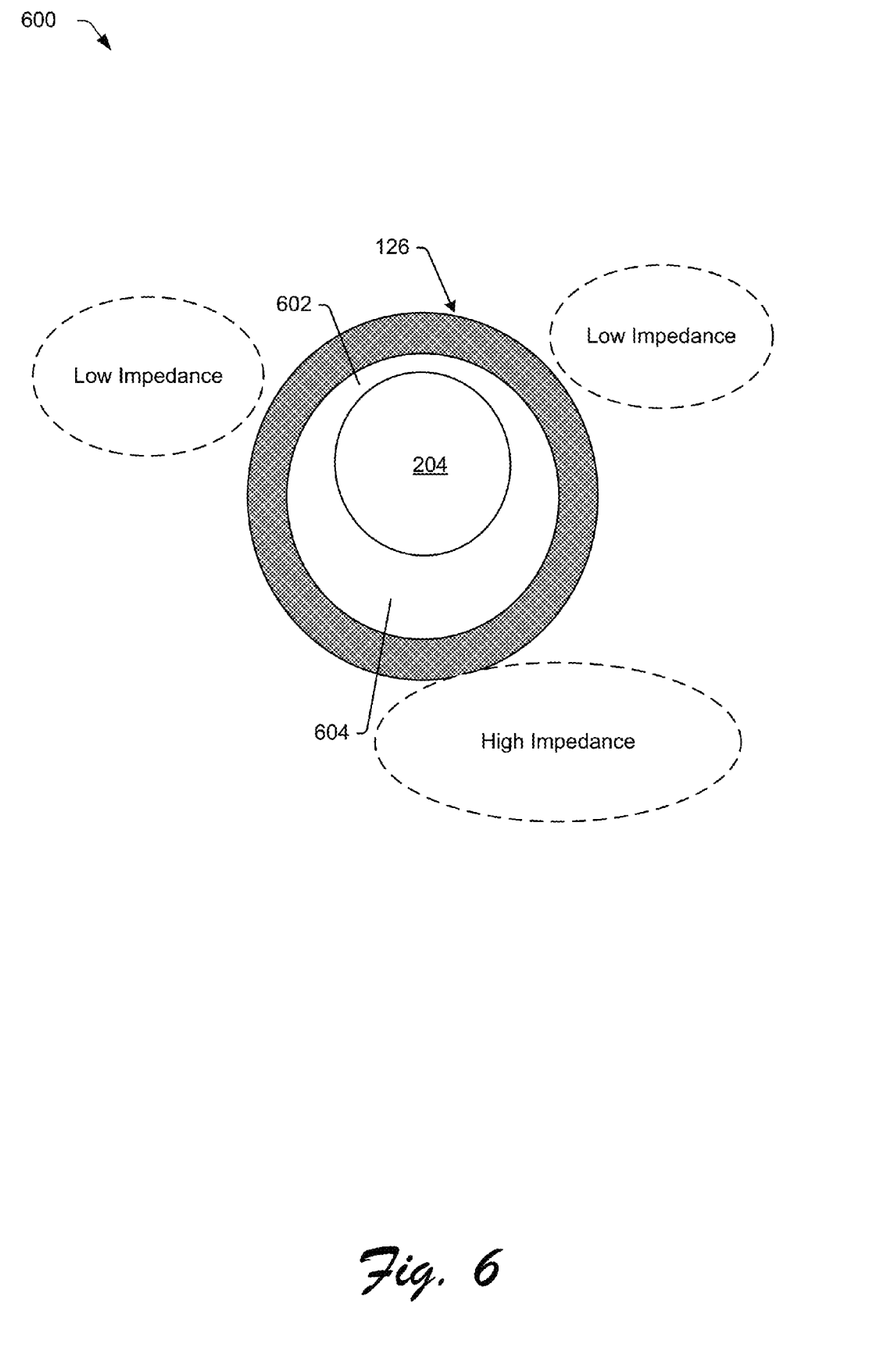
FIG. 6 is a diagram depicting an example in which non-uniform air flow channels are produced by offsetting of a heat sink.

Another technique that may be employed, in addition or alternatively to varying characteristics of heat transfer surfaces, is represented in FIG. 6. In particular, FIG. 6 depicts generally at 600 an example in which non-uniform air flow channels are produced by offsetting of the heat sink 126. In particular, the heat sink 126 in FIG. 6 is depicted as being shifted out of concentric alignment with the blower 204. Here, narrow spacing 602 is created between the heat sink 126 and the blower 204 on one side and wide spacing 604 is created between the heat sink 126 and the blower 204 on and opposing side. The narrow spacing 602 may operate to increase flow impedance relative the wide spacing 604, which may decrease flow impedance. Accordingly, flow may be balanced by selectively offsetting of the heat sink 126 to create narrow spacing 602 in alignment with regions of low impedance and wide spacing 604 in regions of low impedance, as represented in FIG. 6. Offsetting of the heat sink 126 may be employed with a heat sink 126 that has a uniform arrangement of heat transfer surfaces 310. Alternatively, offsetting of the heat sink 126 may be used in combination with a non-uniform arrangement of heat transfer surfaces 310 to provide additional control for system air flow balancing.

Example Procedure

Figure 7:
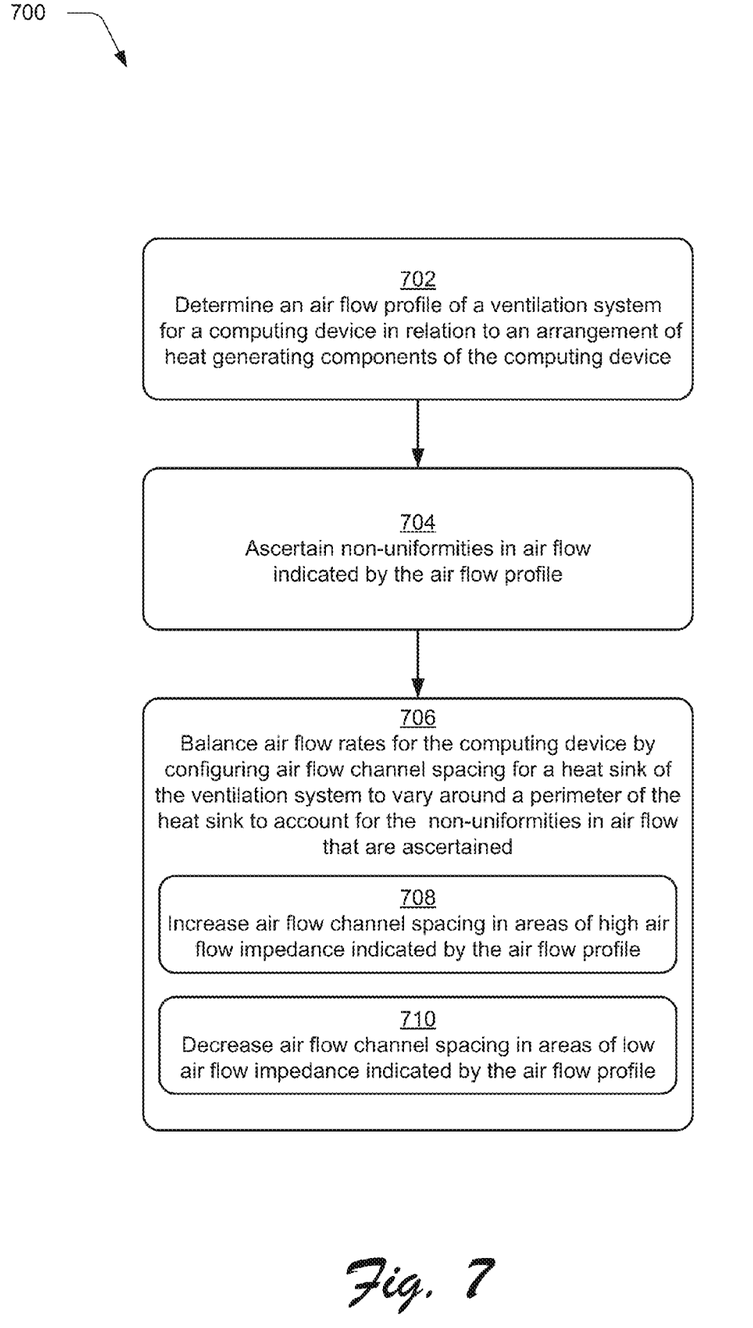
FIG. 7 is a flow diagram that depicts an example procedure for configuring a uniform flow heat sink in accordance with one or more implementations.

This section provides a discussion of an example procedure 700 of FIG. 7 that illustrate details of configuring a uniform flow heat sink in accordance with one or more implementations. The example procedure(s) described herein can be implemented in connection with any suitable hardware, software, firmware, or combination thereof.

An air flow profile of a ventilation system for a computing device in relation to an arrangement of heat generating components of the computing device is determined (block 702). Then, non-uniformities in air flow indicated by the air flow profile are ascertained (block 704). For example, an air flow profile for a ventilation system 124 of a computing device 102 may be generated experimentally or based on computer modeling of the system. The air flow profile may show or otherwise indicate regions associated with different flow and impedance characteristics, such as discussed in relation the example of FIG. 4 previously. Thus, various non-uniformities may be identified using the profile.

Air flow rates for the computing device are balanced by configuring air flow channel spacing for a heat sink of the ventilation system to vary around a perimeter of the heat sink to account for the non-uniformities in air flow that are ascertained (block 706). The balancing is designed to compensate for the non-uniformities and create a more uniform flow profile. To do so, air flow channel spacing is increased in areas of high air flow impedance indicated by the air flow profile (block 708) and air flow channel spacing is decreased in areas of low air flow impedance indicated by the air flow profile (block 710). Configuring of air flow channel spacing may be accomplished by varying characteristics of heat transfer surfaces 310 as discussed previously, such as by radially varying one or more of pitch angles, spacing, concentration, size, shape, or positioning of the heat transfer surfaces 310 around the perimeter of the heat sink. Configuring of air flow channel spacing may also include offsetting of the heat sink 126 with respect to a blower 204 to selectively create a non-uniform arrangement of air flow channel spacing.

Figure 8:
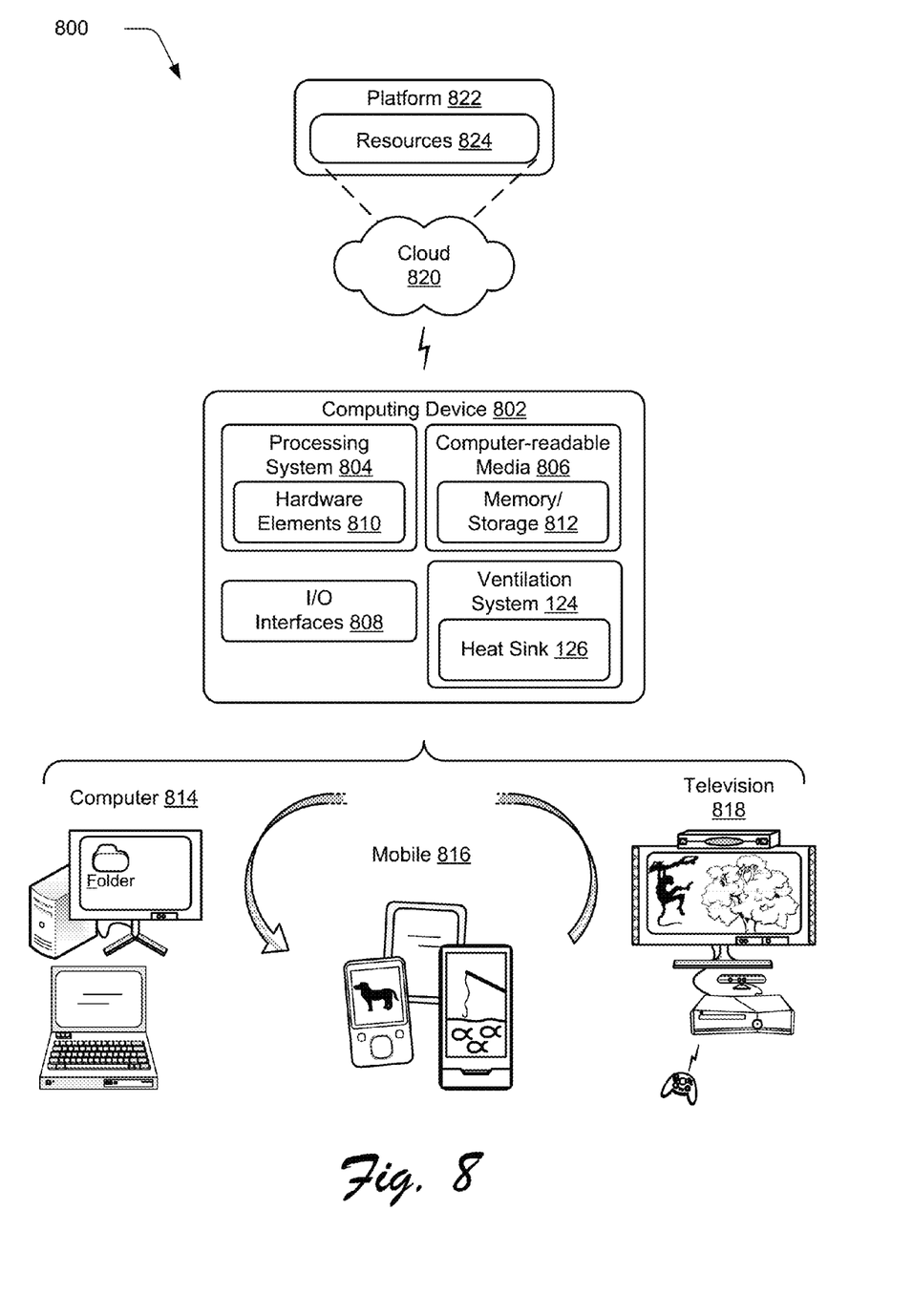
FIG. 8 illustrates an example system including various components of an example device that can be implemented as any type of computing device as described with reference to FIGS. 1-7 to implement aspects of the techniques described herein.

Having considered the foregoing example details and procedures related to implementations of a uniform flow heat sink for a ventilation system, consider now a discussion of example systems, devices, and components that may be make use of heat sinks as described herein in one or more implementations Example System and Device FIG. 8 illustrates an example system generally at 800 that includes an example computing device 802 that is representative of one or more computing systems and/or devices that may implement the various techniques described herein. The computing device 802 may be, for example, a server of a service provider, a device associated with a client (e.g., a client device), an on-chip system, and/or any other suitable computing device or computing system.

The example computing device 802 as illustrated includes a processing system 804, one or more computer-readable media 806, and one or more I/O interface 808 that are communicatively coupled, one to another. The computing device may also include a ventilation system 124 having a heat sink 126 as described herein. Although not shown, the computing device 802 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 804 is representative of functionality to perform one or more operations using hardware. Accordingly, the processing system 804 is illustrated as including hardware element 810 that may be configured as processors, functional blocks, and so forth. This may include implementation in hardware as an application specific integrated circuit or other logic device formed using one or more semiconductors. The hardware elements 810 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 806 is illustrated as including memory/storage 812. The memory/storage 812 represents memory/storage capacity associated with one or more computer-readable media. The memory/storage component 812 may include volatile media (such as random access memory (RAM)) and/or nonvolatile media (such as read only memory (ROM), Flash memory, optical disks, magnetic disks, and so forth). The memory/storage component 812 may include fixed media (e.g., RAM, ROM, a fixed hard drive, and so on) as well as removable media (e.g., Flash memory, a removable hard drive, an optical disc, and so forth). The computer-readable media 806 may be configured in a variety of other ways as further described below.

Input/output interface(s) 808 are representative of functionality to allow a user to enter commands and information to computing device 802, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 802 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 802. By way of example, and not limitation, computer-readable media may include "computer-readable storage media" and "computer-readable signal media."

"Computer-readable storage media" refers to media and/or devices that enable storage of information in contrast to mere signal transmission, carrier waves, or signals per se. Thus, computer-readable storage media does not include signal-bearing medium, transitory signals, or signals per se. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" refers to a signal-bearing medium that is configured to transmit instructions to the hardware of the computing device 802, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 810 and computer-readable media 806 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 810. The computing device 802 may be configured to implement particular instructions and/or functions corresponding to the software and/or hardware modules. Accordingly, implementation of a module that is executable by the computing device 802 as software may be achieved at least partially in hardware, e.g., through use of computer-readable storage media and/or hardware elements 810 of the processing system 804. The instructions and/or functions may be executable/operable by one or more articles of manufacture (for example, one or more computing devices 802 and/or processing systems 804) to implement techniques, modules, and examples described herein.

As further illustrated in FIG. 8, the example system 800 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 800, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 802 may assume a variety of different configurations, such as for computer 814, mobile 816, and television 818 uses. Each of these configurations includes devices that may have generally different constructs and capabilities, and thus the computing device 802 may be configured according to one or more of the different device classes. For instance, the computing device 802 may be implemented as the computer 814 class of a device that includes a personal computer, desktop computer, a multi-screen computer, laptop computer, netbook, and so on. Computing device 802 may be a wearable device, such as a watch or a pair of eye glasses, or may be included in a household, commercial, or industrial appliance.

The computing device 802 may also be implemented as the mobile 816 class of device that includes mobile devices, such as a mobile phone, portable music player, portable gaming device, a tablet computer, a multi-screen computer, and so on. The computing device 802 may also be implemented as the television 818 class of device that includes devices having or connected to generally larger screens in casual viewing environments. These devices include televisions, set-top boxes, gaming consoles, and so on.

The techniques described herein may be supported by these various configurations of the computing device 802 and are not limited to the specific examples of the techniques described herein.

Functionality may also be implemented all or in part through use of a distributed system, such as over a "cloud" 820 via a platform 822 as described below. The cloud 820 includes and/or is representative of a platform 822 for resources 824. The platform 822 abstracts underlying functionality of hardware (e.g., servers) and software resources of the cloud 820. The resources 824 may include applications and/or data that can be utilized while computer processing is executed on servers that are remote from the computing device 802. Resources 824 can also include services provided over the Internet and/or through a subscriber network, such as a cellular or Wi-Fi network.

The platform 822 may abstract resources and functions to connect the computing device 802 with other computing devices. The platform 822 may also serve to abstract scaling of resources to provide a corresponding level of scale to encountered demand for the resources 824 that are implemented via the platform 822. Accordingly, in an interconnected device embodiment, implementation of functionality described herein may be distributed throughout the system 800. For example, the functionality may be implemented in part on the computing device 802 as well as via the platform 822 that abstracts the functionality of the cloud 820.

Conclusion

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A computing device comprising:
a housing in which components of the computing device are mounted in an arrangement, the arrangement creating one or more zones of non-uniformities in air flow, the one or more zones defined by an air flow profile; and
a ventilation system for cooling the components of the computing device having a blower and heat sink configured to form air flow channels that have varied spacing around a perimeter of the blower to compensate for the one or more zones of non-uniformities in the air flow, the varied spacing created at least in part by varying characteristics of heat transfer surfaces around the blower, the characteristics including at least one of a spacing of the heat transfer surfaces, positioning of the heat transfer surfaces, and varying a pitch angle of one or more of the heat transfer surfaces of the heat sink, the pitch angles of the one or more heat transfer surfaces varying radially from an axis of rotation of the blower at a proximate end of each of the heat transfer surfaces next to the blower, the varying pitch angles selected to compensate for the one or more zones of non-uniformities in the air flow.

2. A computing device as described in claim 1, wherein the components comprise one or more heat-generating devices.

3. A computing device as described in claim 1, wherein the pitch angles are varied radially around the blower based on the air flow profile.

4. A computing device as described in claim 1, wherein the varied spacing is created at least in part by varying a concentration of the heat transfer surfaces radially around the blower.

5. A computing device as described in claim 1, wherein the varied spacing is further created at least in part by varying the characteristics of the heat transfer surfaces around the blower, the characteristics including one or more of concentration, sizes, shapes, or alignment of the heat transfer surfaces.

6. A computing device as described in claim 1, wherein the varied spacing is created at least in part by offsetting of the heat sink from concentric alignment with the blower.

7. A computing device as described in claim 1, wherein air flow channel spacing is increased in areas of high impedance relative to a heat sink having uniform spacing.

8. A computing device as described in claim 1, wherein air flow channel spacing is decreased in areas of low impedance relative to a heat sink having uniform spacing.

9. A computing device as described in claim 1, wherein the blower comprises a centrifugal blower mounted within the housing to draw air and disperse the air throughout the computing device via one or more flow conduits integrated within the housing.

10. A ventilation system for a computing device comprising:
a blower for mounting within a housing of the computing device to provide air flow for cooling of components arranged within the housing; and
a heat sink having heat transfer surfaces arranged with the blower, one or more characteristics of the heat transfer surfaces varying radially around the blower to compensate for non-uniformities in air flow indicated by an air flow profile for the ventilation system, the one or more characteristics including at least one of a spacing of the heat transfer surfaces, positioning of the heat transfer surfaces, and a pitch angle of the heat transfer surfaces varying radially from an axis of rotation of the blower at a proximate end of each of the heat transfer surfaces next to the blower.

11. A ventilation system as described in claim 10, wherein the one or more characteristics of the heat transfer surfaces varying radially around the blower further includes one or more of concentration, sizes, shapes, or alignment of the heat transfer surfaces.

12. A ventilation system as described in claim 10, wherein varying the one or more characteristics of the heat transfer surfaces forms varied air flow spacing radially around the blower that compensates for the non-uniformities in air flow indicated by the air flow profile.

13. A ventilation system as described in claim 10, wherein the heat sink is offset from concentric alignment with the blower to create varied air flow spacing between the heat sink and the blower.

14. A ventilation system as described in claim 10, wherein the heat transfer surfaces comprise thin fin structures.

15. A ventilation system as described in claim 10, further comprising one or more heat expelling devices configured to draw heat away from at least some of the components arranged within the housing to the heat sink for cooling via the blower.

16. A ventilation system as described in claim 10, wherein the air flow profile is ascertained by at least one of modeling uniformity of the air flow within the housing or experimentally determining uniformity of the air flow within the housing.

17. A method comprising:
   determining an air flow profile of a ventilation system for a computing device in relation to an arrangement of heat generating components in a housing of the computing device;
   ascertaining non-uniformities in air flow in the housing as indicated by the air flow profile;
   balancing air flow rates for the computing device by configuring air flow channel spacing for a heat sink of the ventilation system to vary around a perimeter of the heat sink, the air flow channel spacing varied at least in part by varying characteristics of heat transfer surfaces of the heat sink radially around the perimeter of the heat sink, the characteristics including positioning of the heat transfer surfaces and varying pitch angles of the heat transfer surfaces, the pitch angles of the heat transfer surfaces varying radially from an axis of rotation of a blower at a proximate end of each of the heat transfer surfaces next to the blower;
   the air flow channel spacing accounting for the non-uniformities in the air flow that are ascertained, including:
      increasing the air flow channel spacing in areas of high impedance indicated by the air flow profile; and
      decreasing the air flow channel spacing in areas of low impedance indicated by the air flow profile.

18. A method as described in claim 17, wherein configuring the air flow channel spacing for the heat sink comprises offsetting a position of the heat sink with respect to the blower of the ventilation system to create varied spacing between the heat sink and the blower.

19. A method as described in claim 17, wherein configuring the air flow channel spacing for the heat sink comprises varying the pitch angles of the heat transfer surfaces to compensate for the non-uniformities in the air flow.

20. A method as described in claim 17, wherein the air flow profile is determined by at least one of modeling uniformity of the air flow within the housing or experimentally determining uniformity of the air flow within the housing.

* * * * *